United States Patent [19]
Spitsberg et al.

[11] Patent Number: 5,985,470
[45] Date of Patent: Nov. 16, 1999

[54] THERMAL/ENVIRONMENTAL BARRIER COATING SYSTEM FOR SILICON-BASED MATERIALS

[75] Inventors: Irene T. Spitsberg, Cincinnati, Ohio; Hongyu Wang, Niskayuna, N.Y.

[73] Assignee: General Electric Company, Cincinnati, Ohio

[21] Appl. No.: 09/039,477

[22] Filed: Mar. 16, 1998

[51] Int. Cl.$^6$ ................................................ B32B 17/06
[52] U.S. Cl. .................... 428/689; 428/698; 428/701; 428/702; 428/469; 428/472
[58] Field of Search ................... 428/408, 432, 428/457, 469, 472, 688, 689, 698, 699, 701, 702; 501/88, 8, 32, 89

[56] References Cited

U.S. PATENT DOCUMENTS

| | | | |
|---|---|---|---|
| 5,214,004 | 5/1993 | Bansal | 501/8 |
| 5,391,404 | 2/1995 | Lee et al. | 427/452 |
| 5,683,825 | 11/1997 | Bruce et al. | 428/698 |
| 5,759,932 | 6/1998 | Sangeeta et al. | 501/85 |

*Primary Examiner*—Timothy Speer
*Assistant Examiner*—Bryant Young
*Attorney, Agent, or Firm*—Andrew C. Hess; David L. Narciso

[57] ABSTRACT

A coating system for a substrate containing a silicon-based material, such as silicon carbide-containing ceramic matrix materials containing silicon carbide and used to form articles exposed to high temperatures, including the hostile thermal environment of a gas turbine engine. The coating system includes a layer of barium strontium aluminosilicate (BSAS) as a bond coat for a thermal-insulating top coat. As a bond coat, the BSAS layer serves to adhere the top coat to a SiC-containing substrate. The BSAS bond coat exhibits sufficient environmental resistance such that, if the top coat should spall, the BSAS bond coat continues to provide a level of environmental protection to the underlying SiC-containing substrate.

20 Claims, 1 Drawing Sheet

THERMAL/ENVIRONMENTAL BARRIER COATING SYSTEM FOR SILICON-BASED MATERIALS

This invention was made with Government support under Agreement No. NAS3-26385 awarded by NASA. The Government has certain rights in the invention.

FIELD OF THE INVENTION

This invention relates to coating systems suitable for protecting components exposed to high-temperature environments, such as the hostile thermal environment of a gas turbine engine. More particularly, this invention is directed to a thermal/environmental barrier coating system for a substrate formed of a material containing silicon.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through formulation of iron, nickel and cobalt-base superalloys. However, components formed from superalloys must be provided with some form of thermal and/or environmental protection in order to exhibit adequate service lives in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use. For superalloy components, oxidation-resistant aluminum-based intermetallic diffusion coatings such as platinum aluminide, and oxidation-resistant aluminum-containing overlay coatings such as MCrAlY (where M is iron, cobalt and/or nickel), are widely used as environmental coatings. These coating materials are also used to form bond coats to adhere a TBC, which is typically a metal oxide such as zirconia ($ZrO_2$) that is partially or fully stabilized by yttria ($Y_2O_3$), magnesia (MgO) or other oxides.

While superalloys have found wide use for components throughout gas turbine engines, alternative materials have been proposed. Materials containing silicon, particularly those with silicon carbide (SiC) as a matrix material or a reinforcing material, are currently being considered for high temperature applications, such as combustor and other hot section components of gas turbine engines. In many applications, a protective coating over the Si-containing material is beneficial. For example, protection with a suitable thermal-insulating layer reduces the operating temperature and thermal gradient through the material. Additionally, such coatings can provide environmental protection by inhibiting the major mechanism for degradation of silicon carbide in a corrosive environment, namely, the formation of volatile silicon monoxide (SiO) and silicon hydroxide (Si$(OH)_4$) products. On this basis, besides low thermal conductivity, a critical requirement of a thermal barrier coating system for a SiC-containing material is low activity of silica ($SiO_2$) in its composition. Other important properties for the coating material include a coefficient of thermal expansion (CTE) compatible with the SiC-containing material, low permeability for oxidants, and chemical compatibility with SiC and silica scale. Consequently, the coating essentially has a dual function, serving as a thermal barrier and simultaneously providing protection from the environment. A coating system having this dual function may be termed a thermal/environmental barrier coating (TBC/EBC) system.

While various coating systems have been investigated, each has exhibited shortcomings relating to the above-noted requirements and properties for compatibility with a Si-containing material. For example, an yttria-stabilized zirconia (YSZ) coating serving as a thermal barrier layer exhibits excellent environmental resistance by itself, since it does not contain silica in its composition. However, YSZ exhibits high permeability to oxygen and other oxidants. In addition, YSZ cannot be adhered directly to silicon carbide because of a CTE mismatch. As a result, mullite ($3Al_2O_3.2SiO_2$) has been proposed as a bond coat between a SiC-containing substrate material and a ceramic TBC in order to compensate for differences in CTE. However, mullite exhibits significant silica activity and volatilization at high-temperature exposures to a water vapor-containing environment. This can especially be the case if the YSZ TBC is deposited by electron beam physical vapor deposition (EBPVD) techniques, and consequently has a columnar grain structure that is permeable to oxidant species. Accordingly, there is a need for an improved TBC/EBC system for Si-based materials.

SUMMARY OF THE INVENTION

The present invention generally provides a coating system for a Si-based material, such as those used to form articles exposed to high temperatures, including the hostile thermal environment of a gas turbine engine. Examples of such materials include those with a dispersion of silicon carbide particles as a reinforcement material in a metallic or non-metallic matrix, as well as those having a silicon carbide matrix, and particularly composite materials that employ silicon carbide as both the reinforcement and matrix materials (Si/SiC composites).

The invention is a thermal/environmental barrier coating (TBC/EBC) system that includes a coating of barium strontium aluminosilicate (BSAS) as a bond coat for a thermal-insulating layer. In a preferred embodiment, the coating consists essentially of barium strontium aluminosilicate. As a bond coat, the BSAS coating serves to adhere a top coat, such as a ceramic coating, to a SiC-containing substrate. Suitable materials for the top coat include zirconia partially or fully stabilized with yttria (YSZ), and yttrium silicate.

According to this invention, a bond coat formed of BSAS is able to provide environmental protection to a SiC-containing substrate as a result of being chemically and physically compatible with SiC. In particular, BSAS is chemically compatible in terms of low silica activity and low reactivity with silica, and physically compatible in terms of having a CTE close to that of SiC. Furthermore, diffusivity of oxygen in BSAS is low, thereby inhibiting the growth of an interfacial silica layer at the surface of a Si-based substrate exposed an oxidizing atmosphere, such as that found in the turbine, combustor and augmentor sections of a gas turbine engine. BSAS also exhibits low alumina activity, which inhibits the formation of deleterious aluminosilicates at the interface between the coating and substrate. Advantageously, a BSAS bond coat exhibits sufficient environmental resistance such that, if a top coat adhered to the substrate with the bond coat should spall, the BSAS bond coat will continue to provide a level of environmental protection to the underlying SiC-containing substrate.

Other objects and advantages of this invention will be better appreciated from the following detailed description.

DETAILED DESCRIPTION OF THE INVENTION

Figure 1:
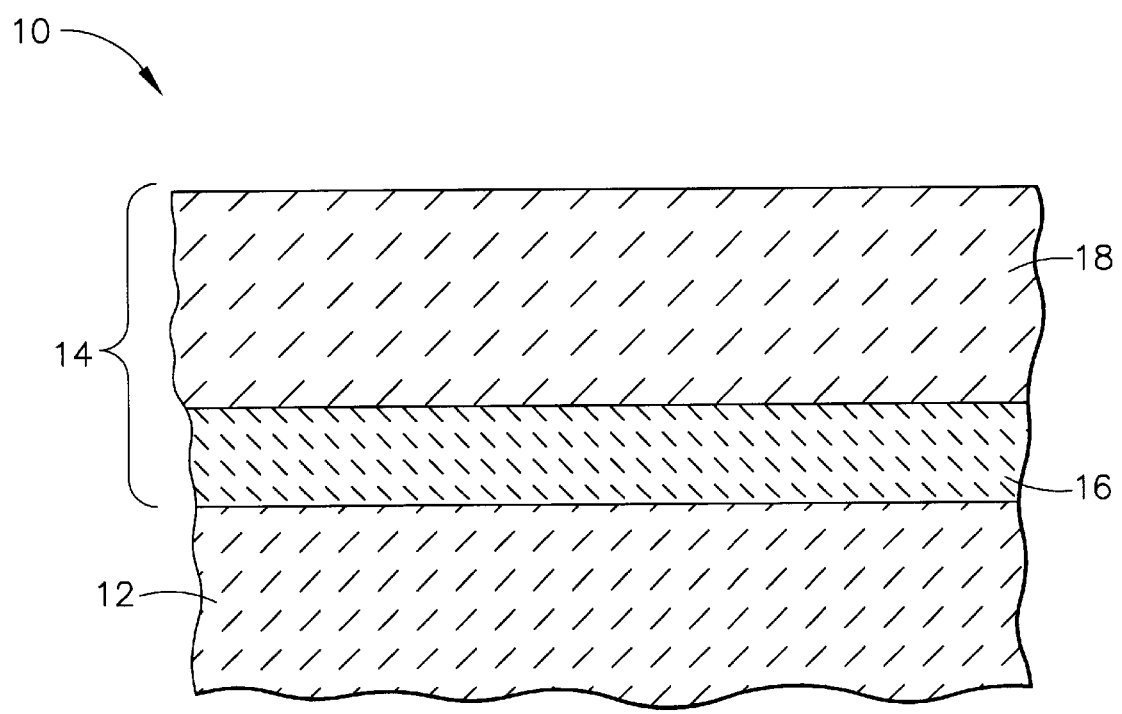
FIG. 1 is a cross-sectional view of a gas turbine engine component having a thermal/environmental barrier coating system in accordance with this invention.

The present invention is generally applicable to components that operate within environments characterized by relatively high temperatures, and are therefore subjected to severe thermal cycling and stresses, oxidation, and corrosion. Notable examples of such components include combustor components, high pressure turbine vanes, and other hot section components of gas turbine engines. A surface region 12 of a hot section component 10 is represented in FIG. 1 for purposes of illustrating the invention. The component 10 or at least the surface region 12 of the component 10 is formed of a SiC/SiC composite material, though the invention is believed to be generally applicable to any material containing a silicon-based material in any form.

As shown in FIG. 1, the surface region 12 is protected by a thermal/environmental barrier coating (TBC/EBC) system 14 that includes a bond coat 16 and a top coat 18. The coating system 14 provides environmental protection to the underlying surface region 12 as well as reduces the operating temperature and thermal gradient through the bond coat 16 and the component 10, thereby enabling the component 10 to survive within higher-temperature environments than otherwise possible. Suitable materials for the top coat 18 include zirconia partially or fully stabilized with yttria (YSZ), e.g., about 7 weight percent yttria, and yttrium silicate, though it is foreseeable that other ceramic materials could be used.

The major mechanism for degradation of silicon carbide in a corrosive environment is the formation of volatile silicon monoxide (SiO) and silicon hydroxide ($Si(OH)_4$) products. The diffusivity of oxidants in materials suitable for the top coat 18 is generally very high. Therefore, in order to protect the SiC-containing surface region 12, the bond coat 16 must exhibit low diffusivity to oxidants, e.g., oxygen and water vapor, to inhibit oxidation of the silicon carbon within the surface region 12, while also being sufficiently chemically and physically compatible with the surface region 12 to remain adherent to the region 12 under severe thermal conditions. According to this invention, the bond coat 16 fulfills these requirements if formed of barium strontium aluminosilicate (BSAS). In a preferred embodiment, the coating consists essentially of barium strontium aluminosilicate. A suitable thickness for the BSAS bond coat 16 is about 25 to about 500 $\mu$m, though greater and lesser thicknesses could foreseeably be used.

As indicated above, the BSAS bond coat 16 of this invention provides adhesion of the top coat 18 and is physically compliant with a SiC-containing substrate. Simultaneously, the BSAS bond coat 16 serves as an environmental barrier, since it exhibits low silica activity and low diffusivity to oxidants, thereby inhibiting the growth of an interfacial silica layer at the surface region 12 when the component 10 is exposed to the oxidizing environment of a gas turbine engine. BSAS is also physically compatible with the SiC-containing surface region 12 in terms of having a CTE of about 5.27 ppm/°C., as compared to a CTE of about 4.9 ppm/°C. for SiC ceramic matrix composites (CMC). Finally, BSAS exhibits low alumina activity, which inhibits the formation of aluminosilicates that would create an undesirable CTE mismatch at the interface between the bond coat 16 and surface region 12. As a result, the TBC/EBC system 14 of this invention is able to thermally and environmentally protect the SiC-containing surface region 12 over numerous thermal cycles and at elevated temperatures as a result of being chemically and physically compatible with SiC. Advantageously, the BSAS bond coat 16 of this invention exhibits sufficient environmental resistance such that, if the top coat 18 were to spall, the bond coat 16 continues to provide a level of environmental protection to the underlying SiC-containing surface region 12.

As with prior art bond coats and environmental coatings, the BSAS bond coat 16 of this invention can be deposited by air and vacuum plasma spraying (APS and VPS, respectively), though it is foreseeable that deposition could be performed by other known techniques, such as physical vapor deposition (PVD) and high velocity oxy-fuel (HVOF). The top coat 18 can be deposited on the bond coat by known techniques, including plasma spraying and PVD techniques. Thereafter, a heat treatment may be performed after deposition of the bond coat 16 and/or top coat 18 to relieve residual stresses created during cooling from elevated deposition temperatures.

While our invention has been described in terms of a preferred embodiment, it is apparent that other forms could be adopted by one skilled in the art. In particular, the benefits of the thermal/environmental barrier coating system of this invention can be realized for various substrate materials containing silicon or a silicon-based material. Accordingly, the scope of our invention is to be limited only by the following claims.

What is claimed is:

1. An article comprising:
   a substrate comprising silicon;
   a bond coat on the substrate, the bond coat comprising barium strontium aluminosilicate; and
   a top coat on the bond coat.

2. An article as recited in claim 1, wherein the bond coat consists essentially of barium strontium aluminosilicate.

3. An article as recited in claim 1, wherein the bond coat consists of barium strontium aluminosilicate.

4. An article as recited in claim 1, wherein the top coat is a ceramic material.

5. An article as recited in claim 1, wherein the top coat is formed of a material selected from the group consisting of yttria stabilized zirconia and yttrium silicate.

6. An article as recited in claim 1, wherein the substrate is formed of silicon carbide particles dispersed in a matrix material.

7. An article as recited in claim 1, wherein the substrate is formed of a composite having a silicon carbide matrix.

8. An article as recited in claim 1, wherein the substrate is formed of a composite having silicon carbide reinforcement in a silicon carbide matrix.

9. An article as recited in claim 1, wherein the bond coat has a thickness of about 25 to about 500 micrometers.

10. An article as recited in claim 1, wherein the article is a component of a gas turbine engine.

11. An article comprising:
    a substrate containing silicon carbide;
    a bond coat on the substrate, the bond coat consisting of barium strontium aluminosilicate; and
    a thermal-insulating layer overlying the bond coat.

12. An article as recited in claim 11, wherein the thermal-insulating layer is selected from the group consisting of yttria stabilized zirconia and yttrium silicate.

13. An article as recited in claim 11, wherein the substrate is formed of silicon carbide particles dispersed in a matrix material.

14. An article as recited in claim 11, wherein the substrate is formed of a composite having a silicon carbide matrix.

15. An article as recited in claim 11, wherein the substrate is formed of a composite having silicon carbide reinforcement in a silicon carbide matrix.

16. An article as recited in claim 11, wherein the bond coat has a thickness of about 25 to about 500 micrometers.

17. An article as recited in claim 1, wherein the article is a component of a gas turbine engine.

18. A gas turbine engine component having a coating system on a surface thereof, the component comprising:

a substrate comprising a silicon;

a bond coat on the substrate, the bond coat consisting of barium strontium aluminosilicate; and a yttria stabilized zirconia layer overlying the bond coat.

19. A component as recited in claim 18, wherein the bond coat has a thickness of about 25 to about 500 micrometers.

20. A component as recited in claim 18, wherein the substrate is formed of a material selected from the group consisting of metal matrix composites reinforced with silicon carbide, composites having a silicon carbide matrix, and silicon carbide matrix composites reinforced with silicon carbide.

* * * * *